United States Patent [19]

Striedieck

[11] Patent Number: 4,931,072
[45] Date of Patent: Jun. 5, 1990

[54] METHOD OF BREAKING FOAM, AND ARRANGEMENT FOR THE SAME

[75] Inventor: Walter Striedieck, Schwarzenbruck, Fed. Rep. of Germany

[73] Assignee: Schering Aktiengesellschaft, Berlin, Fed. Rep. of Germany

[21] Appl. No.: 257,968

[22] Filed: Oct. 13, 1988

[30] Foreign Application Priority Data

Oct. 26, 1987 [DE] Fed. Rep. of Germany ....... 3736578

[51] Int. Cl.$^5$ .............................................. B01D 19/02
[52] U.S. Cl. ........................................... 55/87; 55/78; 55/233
[58] Field of Search ............................ 55/87, 178, 233

[56] References Cited

U.S. PATENT DOCUMENTS 3,335,549  8/1967  Hendrix ................................. 55/178
3,960,525  6/1976  Coggins ................................. 55/87
4,629,475  12/1986  McArdle et al. ..................... 55/178

FOREIGN PATENT DOCUMENTS 118713  9/1981  Japan ..................................... 261/98

Primary Examiner—Bernard Nozick
Attorney, Agent, or Firm—Michael J. Striker

[57] ABSTRACT

In a method and an arrangement for breaking a foam, especially in installation for wet chemical treatment of printed circuit boards with stations in which a treatment liquid is sprayed in a working plane onto a substrate to be treated and from where it is discharged into a supply tank located underneath, a produced foam is aspirated from a supply tank, and the aspirated foam is passed through at least one chamber which contains filling bodies on which foam bubbles burst on contact therewith.

8 Claims, 1 Drawing Sheet

U.S. Patent
Jun. 5, 1990
4,931,072
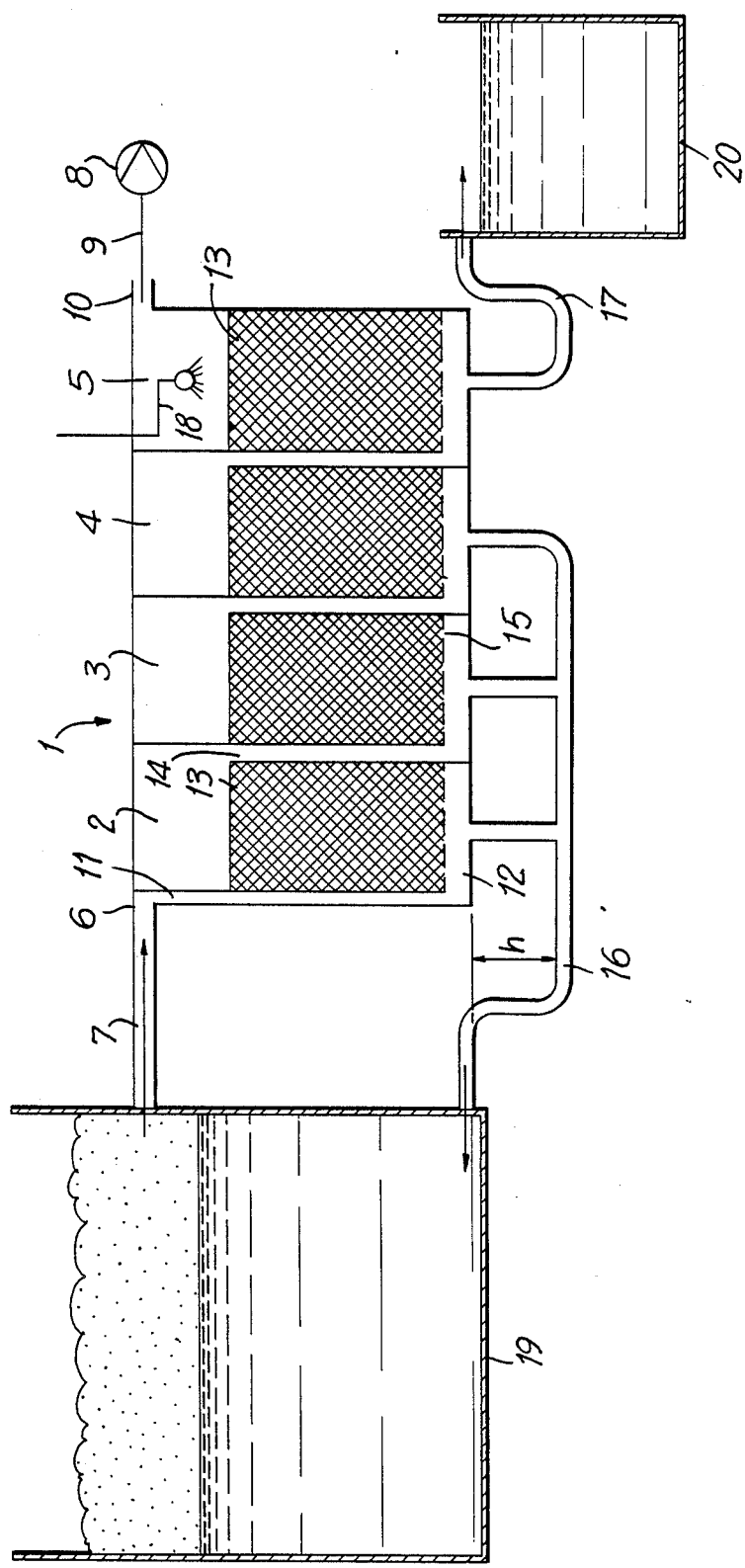

METHOD OF BREAKING FOAM, AND ARRANGEMENT FOR THE SAME

BACKGROUND OF THE INVENTION

The present invention relates to a method of breaking foam as well as to an arrangement for breaking a foam.

More particularly, it relates to a method and an arrangement for breaking a foam, especially in installations of wet chemical treatment of printed circuit boards, with stations in which a treatment liquid is sprayed in a working plane onto a substrate to be treated and from where it is discharged into a supply tank located underneath.

During a wet chemical treatment of printed circuit boards process steps are utilized in which during the treatment of printed circuit boards a foam is produced. Such process steps are for example a stripping of a photoresist with alkali solutions, or the development of the resist.

The treatment of the printed circuit boards is in many cases performed in throughgoing installations, in which the boards are transported in a horizontal position through the treatment stations and between them. The liquid treatment chemicals are conventionally sprayed through nozzles onto the surfaces to be treated.

Pumps are utilized for transporting the treatment liquids. They aspirate the liquids from a supply tank which is located underneath the treatment plane, and transport the same to the nozzles. From the treatment plane, the liquid runs back to the supply tank.

During spraying of the liquid and its discharge back to the supply tank, the process can lead to the formation of a foam for example during the above mentioned treatment steps. The volume of the foam continuously increases with progressing duration of the treatment. Without measures for suppressing the foam formation, the foam discharges through the openings with which the supply tank communicates with the atmosphere. If all these openings were sealed, which would lead to considerable expenses, the foam would still escape through unavoidable openings in the treatment plane of the printed circuit boards.

All measures must be taken to eliminate or at least to reduce the foam formation. Conventionally for this purpose anti-foaming agents are added to the solution and prevent in a chemical manner the generation of the foam. The anti-foaming agents prevent or reduce the foam formation. However, they possess the disadvantage that they act in an unfavorable manner on the efficiency of the treatment solution. Also, with the increased time of the utilization of the treatment solution, an increased portion of the anti-foaming agents can be added, since the solution such as for example for stripping of photoresist always receives more organic components which cause the foam generation. These methods of foam suppression involve significant costs and their utilization is very expensive.

SUMMARY OF THE INVENTION

Accordingly, it is an object of the present invention to provide a method of and arrangement for breaking a foam, which permits the breakage of foam without the utilization of anti-foaming agents.

In keeping with these objects and with others which will become apparent hereinafter, one feature of the present invention resides, briefly stated, in a method of breaking a foam in accordance with which a foam produced in a supply tank is aspirated from the latter and supplied through one or several chambers which contain a plurality of filling bodies so that the foam bubbles burst on the bodies upon contact.

Another feature of the present invention is that an arrangement is provided for breaking a foam, which has means for aspirating a foam produced in a supply tank from the supply tank, and one or a plurality of chambers through which the aspirated foam is supplied and which are filled with a plurality of bodies so that the foam bubbles burst on filling bodies upon contact.

When the method is performed and the arrangement is designed in accordance with the above specified features, the foam formation is reliably prevented without the utilization of anti-foaming agents.

In accordance with further features of the present invention, the method can be performed with the use of a negative pressure.

Still another feature of the present invention is that the filling bodies in the chambers can be formed as Raschig- or Pall-rings, or synthetic plastic chips.

Still another feature of the present invention is that the chambers can communicate in their lower part with a supply tank through a conduit provided with a syphon.

Finally, at least the left chamber can be connected via a conduit provided with a syphon with a waste-water treatment device.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

The single FIGURE of the drawing is a view which schematically shows an arrangement for breaking a foam in accordance with the present invention.

DESCRIPTION OF A PREFERRED EMBODIMENT

An arrangement in accordance with the present invention is schematically shown in FIG. 1 and identified as a whole with reference numeral 1. The arrangement is used for liquefication of foam and includes four successively arranged chambers 2, 3, 4, 5. The first chamber has a connecting pipe 6 which is connected with a conduit 7. The conduit 7 serves for supplying a foam from the place of its generation, for example from a supply tank 19 of a station for treatment of printed circuit boards, such as a stripping station. For producing a negative pressure in accordance with the present invention, a suction impeller 8 is provided. It is connected through a conduit 9 with a pipe 10 of the last chamber 5.

The foam which is supplied through the conduit 7 flows through a separating compartment 11 into a lower region 12 of the first chamber 2. Then it is aspirated through the region of the first chamber 2, which is filled with filling bodies 13.

On its way through the filling bodies 13, the flowing stream of the foam is subdivided into a plurality of small partial streams, and a great number of foam bubbles comes into intimate contact with the filling bodies 13 and their edges. Thereby many foam bubbles burst and this process is supported by the negative pressure which acts in the whole arrangement 1.

A part of the foam however escapes through the region of the filling bodies 13 upwardly. This part of the foam flows through a next separating compartment 14 into a lower region 15 of the next chamber 3. The same process which occurred in the region of the filling bodies 13 now occurs in the region 15 of the chamber 3. In the same manner smaller residual amounts of foam reach the chambers 4 and 5, and the foam bubbles are destroyed there.

The liquid which is produced from the foam is discharged through a conduit 16. For maintaining the negative pressure in the arrangement, the conduit must be designed so that in the conduit 16 a water column always remains with a height greater than the value of the negative pressure.

As can be seen from FIG. 1, the conduit 16 is connected only with the chambers 2, 3 and 4. A separate conduit 17 extends from the chamber 5, since in this chamber there is a possibility that an anti-foaming agent is brought onto the filling bodies 13 by a spraying device 18. This can be provided for eventually dissolving the available foam residue. Then the liquid from this chamber 5 can be returned not to the supply tank of the station, but instead advantageously to a waste water treatment plant 20. In contrast, it is advantageous in accordance with the inventive process that the liquid supplied back from the chambers 2, 3 and 4 has the original condition and can be further utilized.

It will be understood that each of the elements described above, or two or more together, may also find a useful application in other types of constructions differing from the types described above.

While the invention has been illustrated and described as embodied in a method of destroying a foam and an arrangement provided for the same, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method for breaking foam, in an installation for set chemical treatment of printed circuit boards and comprising a plurality of stations in which a treatment liquid is sprayed onto a substrate to be treated and thereafter is collected in a supply tank, said method comprising the steps of providing a plurality of serially connected chambers arranged in a side-by-side relationship and containing filling bodies on which foam bubbles burst upon contact therewith; and producing a negative pressure to provide for aspirating of a produced foam from the supply tank and for flow of the foam successively through the plurality of serially connected chambers and separating liquid from the foam.

2. An arrangement for breaking foam, in an installation for wet chemical treatment of printed circuit boards and comprising a plurality of stations in which a treatment liquid is sprayed onto a substrate to be treated and thereafter is collected in a supply tank, said arrangement comprising a plurality of serially connected chambers arranged in a side-by-side relationship and containing filling bodies on which foam bubbles burst upon contact therewith; means for producing a negative pressure that provides for aspirating of a produced foam from the supply tank and for flow of the foam successively through said plurality of serially connected chambers; and means for removing the treatment liquid from each of said chambers.

3. An arrangement as defined in claim 2, wherein said filling bodies in said chambers are formed as Raschig-rings.

4. An arrangement as defined in claim 2, wherein said filling bodies in said chambers are formed as Pall-rings.

5. An arrangement as defined in claim 2, wherein said filling bodies in said chambers are formed as synthetic plastic chips.

6. An arrangement as defined in claim 2, wherein said plurality of serially connected chambers includes a first chamber and a last chamber, said arrangement further comprising a fist conduit for communicating said first chamber with the supply tank and a second conduit for communicating said last chamber with said negative pressure producing means.

7. An arrangement as defined in claim 6, wherein said first chamber has a lower part; and further comprising a conduit provided with a syphon and arranged to communicate said lower part of said first chamber with the supply tank.

8. An arrangement as defined in claim 6, further comprising a third conduit provided with a syphon for communicating said last chamber with a waste water treatment plant.

* * * * *